United States Patent
Montoya et al.

(10) Patent No.: US 11,776,736 B2
(45) Date of Patent: Oct. 3, 2023

(54) ELECTRONIC PACKAGE FOR AN ELECTRICALLY SMALL DEVICE WITH INTEGRATED MAGNETIC FIELD BIAS

(71) Applicant: The United States of America as Represented by the Secretary of the Navy, San Diego, CA (US)

(72) Inventors: Sergio A. Montoya, Chula Vista, CA (US); Benjamin J. Taylor, Escondido, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 930 days.

(21) Appl. No.: 16/718,690

(22) Filed: Dec. 18, 2019

(65) Prior Publication Data

US 2021/0193372 A1    Jun. 24, 2021

(51) Int. Cl.
  *H01F 27/28* (2006.01)
  *G01R 33/025* (2006.01)
  *H01F 6/04* (2006.01)
  *H01F 27/30* (2006.01)

(52) U.S. Cl.
  CPC ......... *H01F 27/289* (2013.01); *G01R 33/025* (2013.01); *H01F 6/04* (2013.01); *H01F 27/306* (2013.01)

(58) Field of Classification Search
  CPC ........ H01F 27/289; H01F 6/04; H01F 27/306; G01R 33/025; G01R 33/0017
  USPC .................................................. 336/200, 232
  See application file for complete search history.

(56) References Cited

U.S. PATENT DOCUMENTS

| 5,113,136 A | * | 5/1992 | Hayashi | G01R 33/025 324/225 |
| 5,122,744 A | * | 6/1992 | Koch | G01R 33/022 505/846 |
| 2004/0155644 A1 | * | 8/2004 | Stauth | G01R 15/207 324/117 R |
| 2009/0315548 A1 | * | 12/2009 | Bonin | G01R 33/025 324/244 |

(Continued)

FOREIGN PATENT DOCUMENTS

| JP | 04136777 A | * | 5/1992 |
| JP | 08015229 A | * | 1/1996 |

(Continued)

*Primary Examiner* — Tszfung J Chan
(74) *Attorney, Agent, or Firm* — Naval Information Warfare Center, Pacific; Kyle Eppele; Paul C. Oestreich (57) ABSTRACT

An electronic package includes a mounting platform for mounting an electrically small device, at least one coil, and an insulator. The coil regulates a magnetic field through the electrically small device at the mounting platform. The coil is adapted to conduct a current for nullifying the magnetic field through the electrically small device at the mounting platform. The insulator is between the mounting platform and the coil for isolating the electrically small device from the coil. An electronic circuit includes this electronic package and the electrically small device mounted at the mounting platform of the electronic package. The electrically small device can be a quantum device and/or a topological device when cooled to a cryogenic temperature. The magnetic field is nullified to prevent the magnetic field from adversely affecting the electrically small device.

16 Claims, 3 Drawing Sheets

(56) References Cited

U.S. PATENT DOCUMENTS

2019/0044047 A1* 2/2019 Elsherbini ......... H01L 23/49888
2019/0385088 A1* 12/2019 Naaman ................ H04B 10/70

FOREIGN PATENT DOCUMENTS

| JP | 2000275312 A | * | 10/2000 | | |
| JP | 2017033978 A | * | 2/2017 | | |
| JP | 2019174324 A | * | 10/2019 | ......... | G01R 33/0011 |

* cited by examiner

ELECTRONIC PACKAGE FOR AN ELECTRICALLY SMALL DEVICE WITH INTEGRATED MAGNETIC FIELD BIAS

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; ssc_pac_t2@navy.mil. Reference Navy Case Number 109259.

BACKGROUND OF THE INVENTION

Electrically small devices include quantum devices and topological devices. Such electrically small devices can be adversely affected by an external magnetic field, such as a geomagnetic field of the Earth.

SUMMARY

An electronic package includes a mounting platform for mounting an electrically small device, at least one coil, and an insulator. The coil regulates a magnetic field through the electrically small device at the mounting platform. The coil is adapted to conduct a current for nullifying the magnetic field through the electrically small device at the mounting platform. The insulator is between the mounting platform and the coil for isolating the electrically small device from the coil. An electronic circuit includes this electronic package and the electrically small device mounted at the mounting platform of the electronic package.

BRIEF DESCRIPTION OF THE DRAWINGS

Throughout the several views, like elements are referenced using like references. The elements in the figures are not drawn to scale and some dimensions are exaggerated for clarity.

FIG. 1 is a cross-sectional diagram through section 1-1 of FIG. 2. FIG. 2 is a cross-sectional diagram through section 2-2 of FIG. 1.

FIG. 3 is a cross-sectional diagram through section 3-3 of FIG. 4 and FIG. 5.

DETAILED DESCRIPTION OF EMBODIMENTS

The disclosed packages and circuits below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
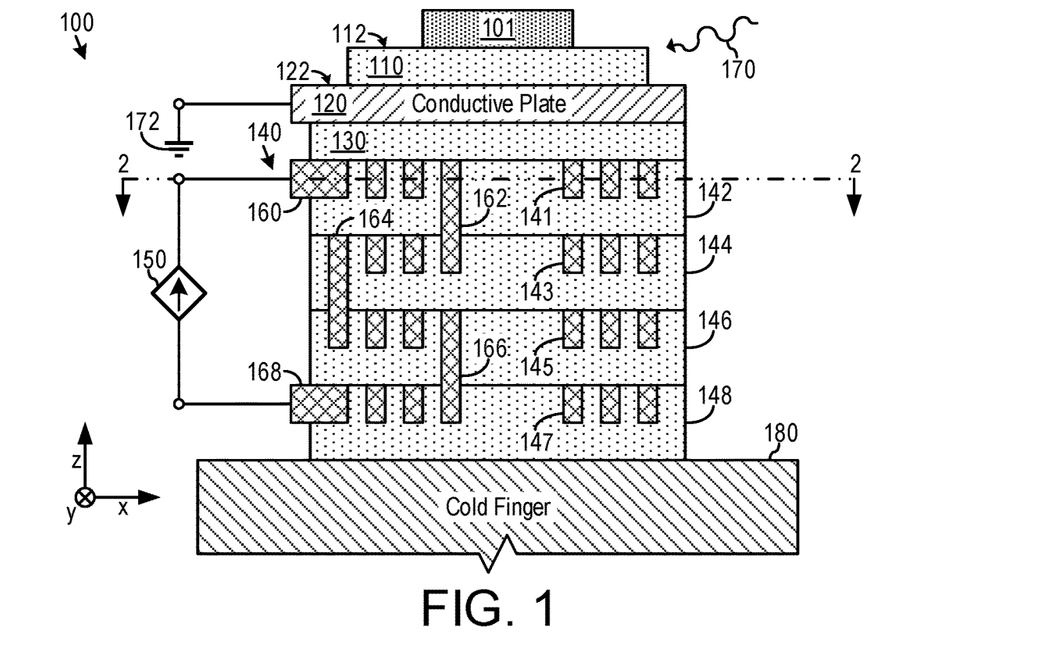
FIGS. 1 and 2 are each a cross-sectional diagram of an electronic package for an electrically small device in accordance with an embodiment of the invention.
Figure 2:
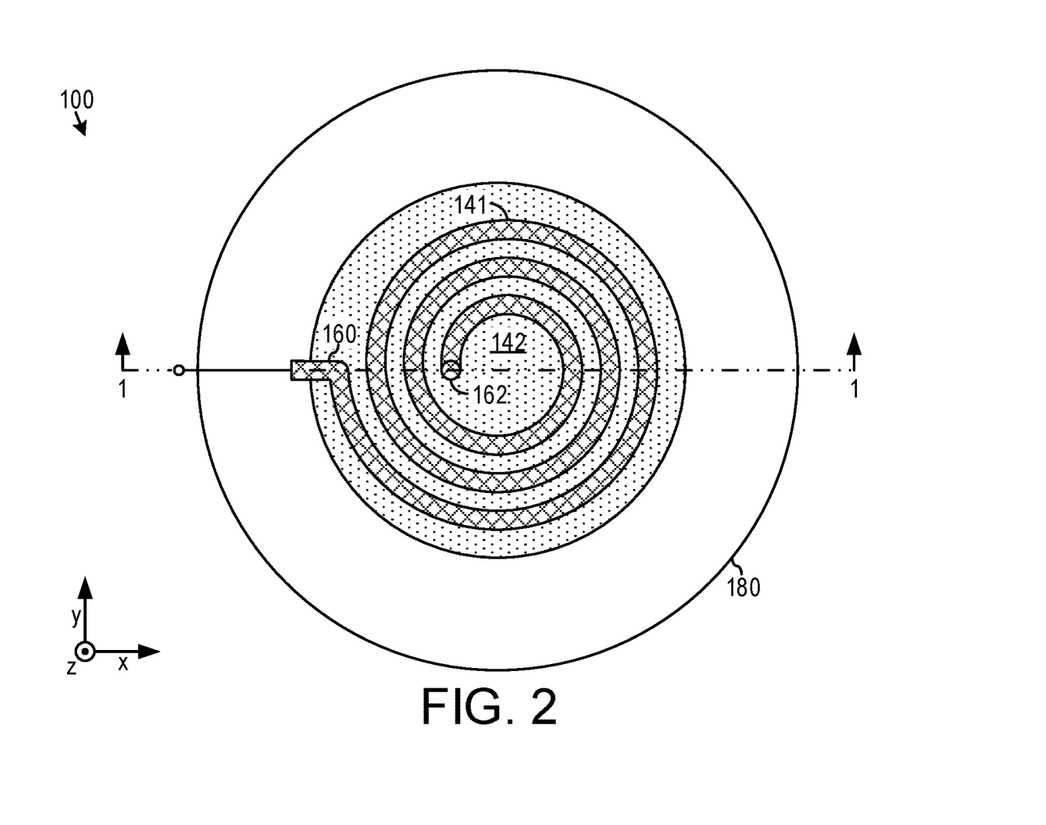

FIGS. 1 and 2 are each a cross-sectional diagram of an electronic package 100 for an electrically small device 101 in accordance with an embodiment of the invention. FIG. 1 is a cross-sectional diagram through section 1-1 of FIG. 2. FIG. 2 is a cross-sectional diagram through section 2-2 of FIG. 1.

The electronic package 100 can be manufactured without and therefore not include the electrically small device 101 to enable production of a single type of electronic package 100 for a variety of different types of the electrically small device 101. The electronic package 100 has a mounting platform for mounting the electrically small device 101. The mounting platform is a surface 112 of an insulator 110 or a surface 122 of a conductive plate 120. The electrically small device 101 can be mounted on surface 122 of a conductive plate 120 via insulator 110. The conductive plate 120 is optional, and when conductive plate 120 is omitted, the insulator 130 is also omitted or is combined with insulator 110. When conductive plate 120 is included, the insulator 110 can be omitted with the electrically small device 101 directly mounted on surface 122 of conductive plate 120.

FIG. 1 shows a coil 140 for regulating a magnetic field through the electrically small device 101 at the mounting platform. For simplicity, FIG. 1 shows only one coil 140; however, it will be appreciated that this embodiment encompasses multiple coils as shown in FIG. 3-10, and that the multiple coils of FIG. 3-10 can have structural features as shown for coil 140 in FIGS. 1 and 2. The coil 140 is adapted to conduct a current for nullifying the magnetic field through the electrically small device 101 at the mounting platform, which is a surface 112 or 122 opposite coil 140. The coil 140 is layered, alternating patterned conductive layers 141, 143, 145, and 147 and insulation layers 142, 144, 146, and 148. Each of the conductive layers 141, 143, 145, and 147 is patterned to form a conductive loop for conducting the current through the coil 140. FIG. 2 shows a cross-section through the conductive loop of patterned conductive layer 141.

A controller 150 is adapted to control the current through the coil 140 to nullify the magnetic field through the electrically small device 101 at the mounting platform. The controller 150 supplies the current via an exterior conductive connector 160 into the conductive loop of patterned conductive layer 141 and this current spirals around three times as shown in FIG. 2 until reaching interior via 162 connecting the conductive loops of patterned conductive layers 141 and 143. Patterned conductive layer 143 is similar to patterned conductive layer 141 shown in FIG. 2, except that the conductive loop of patterned conductive layer 143 is a mirror image, and instead of exterior conductive connector 160, the conductive loop of patterned conductive layer 143 has an exterior via 164, which connects the conductive loops of patterned conductive layers 143 and 145. Patterned conductive layers 145 and 147 are connected by interior via 166, and eventually the current returns to controller 150 via exterior conductive connector 168.

Thus, the conductive loops of patterned conductive layers 141, 143, 145, and 147 form a solenoid in which each conductive loop induces a magnetic field that reinforces the magnetic field induced by the other conductive loops. The maximum strength of the induced magnetic field of coil 140 depends upon factors including the maximum amperage of current driven through the conductive loops, the number of patterned conductive layers 141, 143, 145, and 147, and the number of times the current spirals around in each conductive loop of the patterned conductive layers 141, 143, 145, and 147. It will be appreciated that the conductive layers 141, 143, 145, and 147 can be patterned using photolithography and each include a conductive loop that spirals around many more times than the three times schematically shown in FIG. 2. To avoid stacked vias, such as interior vias 162 and 166 shown stacked in FIG. 1, each conductive loop can spiral around a non-integer number of times. It will also be appreciated that the number of patterned conductive layers 141, 143, 145, and 147 can be more or less than the four layers shown in FIG. 1, and can include a single patterned conductive layer with exterior and interior connectors to controller 150.

A drawback of coil 140 is that coil 140 tends to act as an antenna that collects electromagnetic interference 170, especially electromagnetic interference 170 having a wavelength approximately corresponding to the dimensions of coil 140. This collected electromagnetic interference 170 can generate an oscillating current in coil 140 and this current induces a corresponding oscillating magnetic field from coil 140. This oscillating magnetic field interferes with the operation of the electrically small device 101 for certain types of the electrically small device 101.

When the conductive plate 120 is included between the mounting platform and the coil 140, any oscillating magnetic field from coil 140 reaches the electrically small device 101 predominantly after passing through the conductive plate 120. However, any oscillating magnetic field passing through the conductive plate 120 induces eddy currents within conductive plate 120, and these eddy currents oppose and attenuate the oscillating magnetic field. The degree of attenuation of the oscillating magnetic field depends upon dimensions and other characteristics of the conductive plate 120, such as the thickness of the conductive plate 120 as compared to the skin depth for each frequency of the oscillating magnetic field. The conductive plate 120 is optionally grounded at ground connection 172. When not grounded, floating conductive plate 120 still opposes and attenuates any oscillating magnetic field from coil 140 that induces eddy currents within conductive plate 120. When grounded, the conductive plate 120 is a ground plane that generally opposes and attenuates a wider range of oscillating magnetic fields than a floating conductive plate 120 because the ground connection 172 increases the effective size of the conductive plate 120. Thus, whether grounded or not, the conductive plate 120 shields the electrically small device 101 from electromagnetic interference 170 collected in the coil 140.

When the conductive plate 120 is included, the internal magnetic field that controller 150 intentionally induces from the current through coil 140 also predominantly passes through the conductive plate 120. However, a substantially static portion of the internal magnetic field passes unimpeded through the conductive plate 120 toward the electrically small device 101. In addition, controller 150 can provide a time-varying current that induces a time-varying internal magnetic field from coil 140, and to a certain extent limited by the dynamic range given by the maximum achievable current through coil 140, the controller 150 can amplify the time-varying current to compensate for the conductive plate 120's attenuation of the time-varying internal magnetic field. This can be useful for more completely nullifying the lower-frequency components of electromagnetic interference 170 collected in coil 140 when the conductive plate 120 does not fully attenuate these lower-frequency components.

The insulators 110, 130 between the mounting platform and the coil 140 isolate the electrically small device 101 from the coil 140. The insulators 110, 130 are an electrical insulator for electrically isolating the electrically small device 101 from the coil 140. The internal magnetic field induced from the current in the coil 140 passes unimpeded through the insulators 110, 130 toward the electrically small device 101.

In one embodiment, the insulators 110, 130 and the insulation layers 142, 144, 146, and 148 are each aluminum oxide having an extremely high resistivity, such that the necessary electrical isolation is achieved with a very thin layer of nanometers of the aluminum oxide. Such a thin layer of aluminum oxide presents a small amount of thermal insulation, such that the insulators 110, 130 and the insulation layers 142, 144, 146, and 148 do not significantly impair cryogenic cooling of the electrically small device 101 by cold finger 180. In this embodiment, the conductive loop of each of the patterned conductive layers 141, 143, 145, and 147 is composed of a superconductive material for conducting the current from controller 150 when cooled to a cryogenic temperature. This eliminates heat generated in coil 140, such that the cold finger 180 more readily cools the electrically small device 101 to a cryogenic temperature.

In one embodiment, an electronic circuit includes both the electronic package 100 and the electrically small device 101 mounted on the electronic package 100 at the mounting platform. In this embodiment, the electrically small device 101 is a quantum device and/or a topological device when cooled to a cryogenic temperature by cold finger 180. An example of such a quantum or topological device is a radio frequency (RF) receiver or transmitter vulnerable to decreased sensitivity or other decreased performance unless the coil 140 nullifies the magnetic field through the electrically small device 101. Thus, to prevent decreased performance of the RF receiver or transmitter, the controller 150 is adapted to control the current through the coil 140 for nullifying the magnetic field through the electrically small device 101. In one embodiment, the controller 150 is included within the electrically small device 101.

Figure 3:
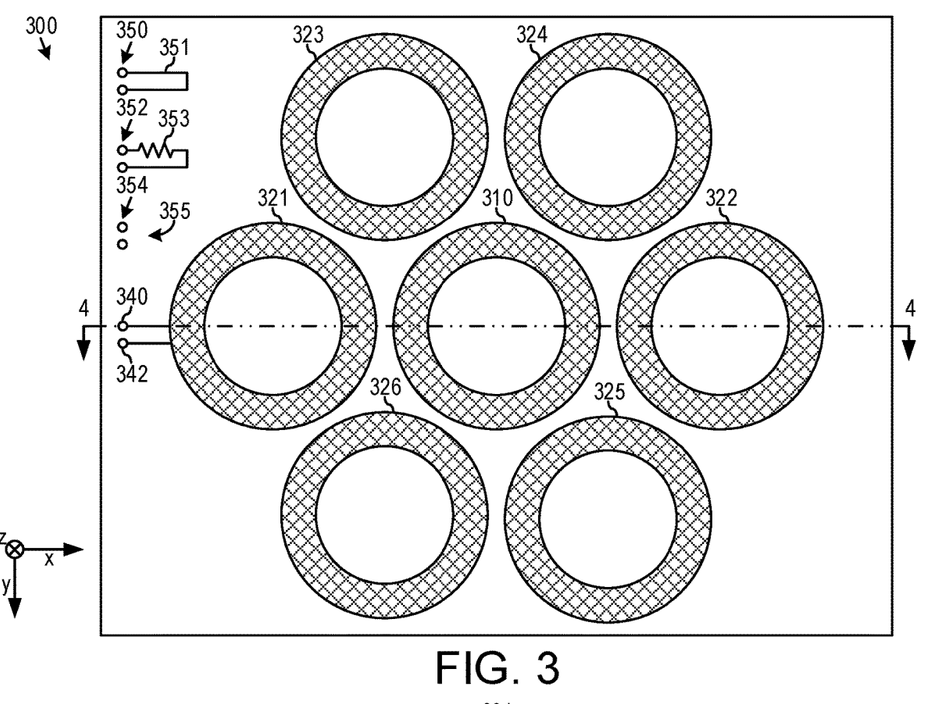
FIG. 3 is a cross-sectional diagram of an electronic package for an electrically small device in accordance with an embodiment of the invention having a central coil and six peripheral coils.

FIG. 3 is a cross-sectional diagram of an electronic package 300 for an electrically small device 101 in accordance with an embodiment of the invention having a central coil 310 and six peripheral coils 321, 322, 323, 234, 325, and 326. FIG. 3 is a cross-sectional diagram through section 3-3 of FIG. 4 and FIG. 5.

Figure 4:
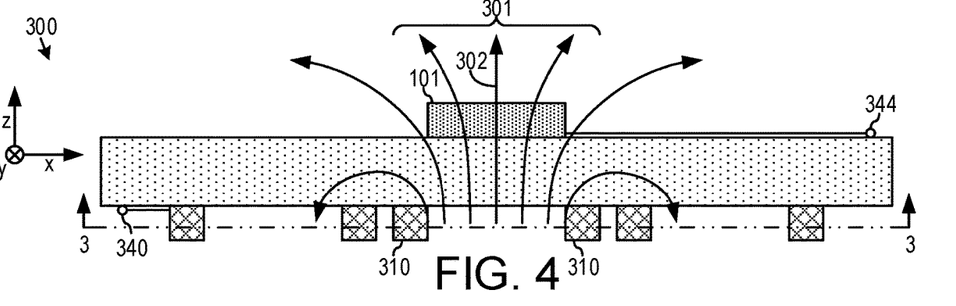
FIG. 4 is a cross-sectional diagram of the electronic package of FIG. 3 through section 4-4 of FIG. 3 showing the induced magnetic field when only the central coil is conducting current.

FIG. 4 is a cross-sectional diagram of the electronic package of FIG. 3 through section 4-4 of FIG. 3 showing the induced magnetic field 301 when only the central coil 310 is conducting current. The induced magnetic field 301 through the electrically small device 101 is approximately upwardly vertical. The induced magnetic field 301 is also rotationally symmetric about a central vertical axis of the magnetic field line 302. Not shown is the portion of the induced magnetic field 301 below the central coil 310; however, because magnetic field lines form closed loops, the portion of the induced magnetic field 301 below the central coil 310 has a similar shape to the shown portion of the induced magnetic field 301.

Figure 5:
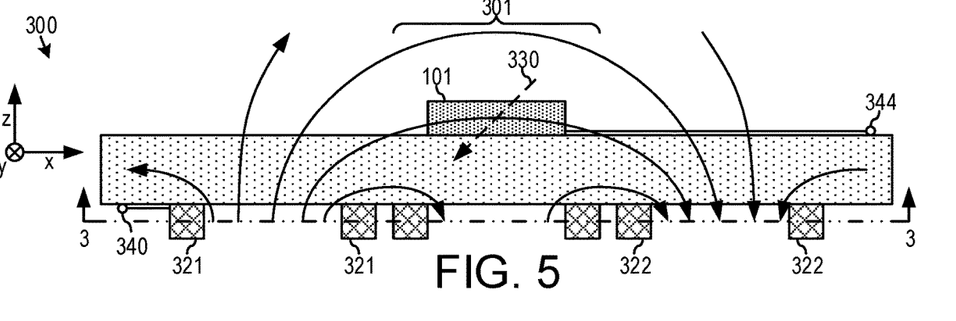
FIG. 5 is a cross-sectional diagram similar to FIG. 4 except that only the left and right coils of FIG. 3 are conducting currents, and these currents are in opposite directions.

FIG. 5 is a cross-sectional diagram similar to FIG. 4 except that only the left coil 321 and the right coil 322 of FIG. 3 are conducting current. The left and right coils 321 and 322 are shown conducting the same amperage of current in opposite directions. This can be alternatively achieved with coils 321 and 322 wound in opposite directions. The induced magnetic field from coil 321 tends to be captured by coil 322, and vice versa, so that the induced magnetic field 301 through the electrically small device 101 is approximately horizontal from left to right.

In general, the central coil 310 and the peripheral coils 321, 322, 323, 234, 325, and 326 are adapted to conduct respective currents that collectively nullify the magnetic field through the electrically small device 101 at the mounting platform. The magnetic field through the electrically small device 101 at the mounting platform is a superposition of an external magnetic field 330 (see dashed line of FIG. 5) including a geomagnetic field of the Earth and the internal magnetic field 301 induced from the currents in the central coil 310 and the peripheral coils 321, 322, 323, 234, 325, and 326. To nullify the magnetic field through the electrically small device 101, these central and peripheral coils are adapted to conduct respective currents for inducing the internal magnetic field 301 that has a same magnitude as the external magnetic field 330 but in an opposing direction.

For example, when the external magnetic field 330 lies in the plane of FIG. 5 directed at a 45 degree angle through the electrically small device 101 as shown with the dashed line of FIG. 5, the induced magnetic field 301 nullifies the external magnetic field 330 when the central coil 310 conducts current of appropriate amperage as shown in FIG. 4 concurrently with the left and right coils 321 and 322 conducting respective currents of appropriate amperage in opposite directions as shown if FIG. 5. With appropriate currents in coils 310, 321, and 322, the superposition of the external magnetic field 330, the induced magnetic field 301 of FIG. 4, and the induced magnetic field 301 of FIG. 5 is a nullified magnetic field through the electrically small device 101.

An advantage of the central coil 310 and the peripheral coils 321, 322, 323, 234, 325, and 326 as shown in FIG. 3 is fairly good decoupling of the nullification of the vertical and horizontal components of the magnetic field through the electrically small device 101. In one embodiment, the electrically small device 101 includes a magnetic field sensor adapted to measure the magnitude of the vertical component of the magnetic field perpendicular to a plane of the mounting platform and adapted to measure the magnitude and in-plane direction of the horizontal component of the magnetic field parallel to the plane of the mounting platform.

In this embodiment, the electrically small device 101 also includes a controller 150 adapted to control the current supplied to central coil 310 and to adjust the amperage of this current until the magnetic field sensor measures no vertical component of the magnetic field through the electrically small device 101. Relying on the arrangement of the peripheral coils 321, 322, 323, 234, 325, and 326 that enables inducing an induced magnetic field 301 oriented in any in-plane direction through the electrically small device 101 with three respective amperages through opposing peripheral coils 321 and 322, opposing peripheral coils 323 and 325, and opposing peripheral coils 324 and 326, controller 150 is adapted to control the three currents supplied to peripheral coils 321, 322, 323, 234, 325, and 326 and to adjust the amperages of these three currents until the magnetic field sensor measures no horizontal component of the magnetic field through the electrically small device 101. This induces the total internal magnetic field 301 having a same magnitude as the external magnetic field 330 but in an opposing direction, and this nullifies the magnetic field through the electrically small device 101 as measured by its magnetic field sensor.

Upon changes in three-dimensional orientation of the electronic circuit and its electrically small device 101 relative to the external magnetic field 330 or the geomagnetic field, the magnetic field sensor is adapted to measure corresponding changes in the horizontal and vertical components of the magnetic field through the electrically small device 101. In response, the controller is adapted to continue to control the current through the central coil 310 and the respective currents through each of the peripheral coils 321, 322, 323, 234, 325, and 326 to induce the internal magnetic field 301 having a same magnitude as the external magnetic field 330 but in an opposing direction to nullify the magnetic field through the electrically small device 101.

Although the central coil 310 and the peripheral coils 321, 322, 323, 234, 325, and 326 as shown in FIG. 3 have fairly good decoupling for nullification of the vertical and horizontal components of the magnetic field through the electrically small device 101, the controller 150 is not required to independently control the vertical and horizontal components of the magnetic field. For example, the induced horizontal magnetic field 301 shown in FIG. 5 has a slight outward bowing at the electrically small device 101, and this slight outward bowing can be flattened with a small current through central coil 310 that induces a weak vertical magnetic field in a direction opposite to that shown in FIG. 4.

Generally, for arrangements of coils having less decoupling than the arrangement of central coil 310 and the peripheral coils 321, 322, 323, 234, 325, and 326 as shown in FIG. 3, such as the arrangements of coils shown in FIG. 6-10, electromagnetic simulations and careful measurement of actual performance can produce the appropriate amperages needed to induce an internal magnetic field that best nullifies any amplitude and three-dimensional direction of the external magnetic field. The controller 150 can include tables or formulae for incrementally updating the respective current through each of the coils given a measurement of an amplitude and a three-dimensional direction of the residual magnetic field currently passing through the electrically small device 101. This produces time-varying currents, and controller 150 can include a transfer function that amplifies certain frequency ranges of the time-varying currents to compensate for expected attenuation produced when conductive plate 102 is included.

The electronic package 300 includes conductive connectors, such as the conductive connector 340 shown in FIG. 3-5 for supplying the respective current to coil 321. The other coils 310, 322, 323, 234, 325, and 326 have similar conductive connectors that are not shown. Because the conductive connector 340 supplying current induces a stray magnetic field that could adversely affect the electrically small device 101, the supply conductive connector 340 and the corresponding return conductive connector 342 are arranged as close as possible to each other so that their stray magnetic fields tend to cancel each other. Returning to FIG. 1, if supply conductive connector 160 is routed immediately to a portion of patterned conductive layer 145 adjacent return conductive connector 168 in patterned conductive layer 147, then supply conductive connector 160 and return conductive connector 168 can be extended to reach controller 150 in patterned conductive layers 145 and 147 while separated only by the thin insulation layer 146, such that the stray magnetic fields of the supply and return currents cancel each other at a short distance from patterned conductive layers 145 and 147.

Other conductive connectors include conductive connector 344 shown in FIGS. 4 and 5 for communicating with the electrically small device 101. For example, when the electrically small device 101 is an RF receiver, the conductive connector 344 carries information specifying the RF signal received by the RF receiver. When the electrically small device 101 is an RF transmitter, the conductive connector 344 carries information specifying the RF signal to be transmitted from the RF transmitter.

In one embodiment, a coaxial cable connects the conductive connector 344 to an external system. Due to the temperature differential between the external system at room temperature and the electrically small device 101 when the electrically small device 101 is cooled to a cryogenic temperature by cold finger 180, the connecting coaxial cable encounters a range of temperatures that affect many properties of the coaxial cable including varying its impedance from the nominal impedance along its length. This varying impedance produces reflections of the RF signal that can corrupt the received RF signal.

However, the external system can compensate when the varying impedance is known. Conductive connectors 350, 352, and 354 help characterize the varying impedance of coaxial cables connected thereto. In one embodiment, conductive connectors 350, 352, and 354 are RP-SMA (reverse polarity surface mount adaptors) respectively connected to an electrical short 351, a nominal impedance 353 of 50 ohms in this example, and an electrical open 355. The external system having a representative coaxial cable connected to each of the conductive connectors 350, 352, and 354 can calibrate properties of the coaxial cable including its varying impedance. The calibration circuit of electrical short 351, nominal impedance 353, and electrical open 355 is provided in electronic package 300 or in electrically small device 101.

Figure 6:
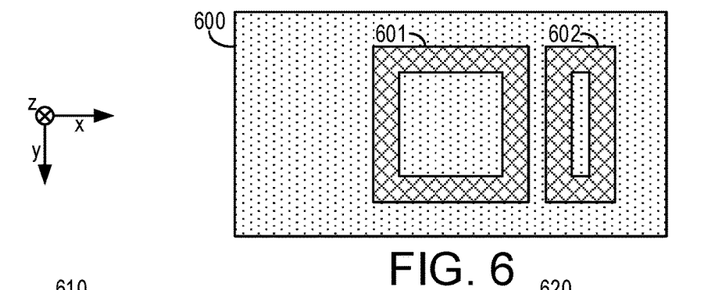
FIGS. 6, 7, 8, 9, and 10 are cross-sectional diagrams of various embodiments of coils of an electronic package for an electrically small device.
Figure 7:
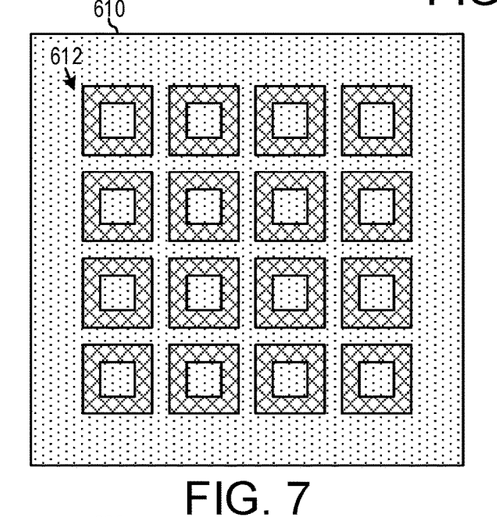
Figure 8:
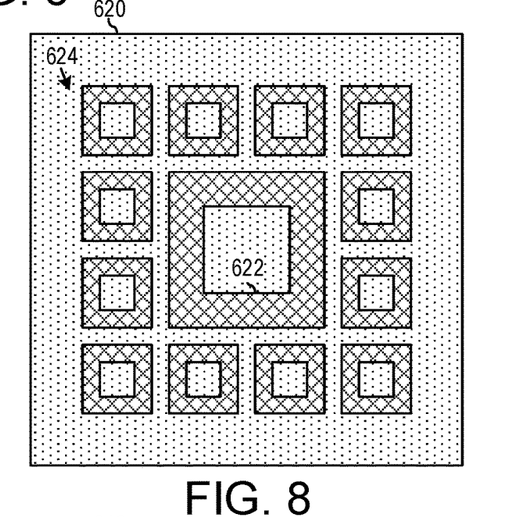

FIGS. 6, 7, 8, 9, and 10 are cross-sectional diagrams of various embodiments of coils of an electronic package for an electrically small device. It will be appreciated that a particular electronic package has layers similar to patterned conductive layers 141, 143, 145, and 147 of FIG. 1, with each patterned conductive layer having the same or different arrangement of coils. For example, the particular electronic package has two patterned conductive layers with one having coils as shown in FIG. 7 and the other having coils as shown in FIG. 8, with each coil on each layer independently driven or with overlapping coils on different patterned conductive layers forming a single coil.

FIG. 6 is a cross-sectional diagram of an electronic package 600 for an electrically small device in accordance with an embodiment of the invention having a central coil 601 and a single peripheral coil 602. One particular type of electrically small device is adversely affected by a component of an external magnetic field lying in a plane, but is not affected by a component of the external magnetic field perpendicular to this plane. For example, the electrically small device is adversely affected by the component of an external magnetic field in the x-z plane of FIG. 6, but not by the component of the external magnetic field along the y axis. A central coil 601 underneath the electrically small device induces a z component of the internal magnetic field at the electrically small device and an adjacent peripheral coil 602 induces an x (and z) component of the internal magnetic field at the electrically small device, such that appropriate currents in coils 601 and 602 induce an internal magnetic field at the electrically small device that nullifies the component in the x-z plane of any external magnetic field. This prevents the external magnetic field from adversely affecting this particular type of electrically small device.

FIG. 6 has the advantage of a simple construction having only two coils 601 and 602, but with the tradeoff of somewhat greater complexity in determining the appropriate currents in coils 601 and 602 for nullifying a measured external magnetic field, and limitation to certain types of electrically small devices. This simple construction outweighs the somewhat greater complexity in certain embodiments where manufacturing cost increases with an increased number of coils and/or manufacturing yield decreases with an increased number of coils.

FIG. 7 is a cross-sectional diagram of an electronic package 610 for an electrically small device in accordance with an embodiment of the invention having sixteen coils 612. The large number of coils increases the flexibility for inducing an internal magnetic field for nullifying an external magnetic field. This flexibility can include that smaller coils 612 induce nearby magnetic fields with more non-linearity, and such a non-linear induced magnetic field can help nullify the external magnetic field at the electrically small device.

FIG. 8 is a cross-sectional diagram of an electronic package 620 for an electrically small device in accordance with an embodiment of the invention having a central coil 622 and twelve peripheral coils 624.

Figure 9:
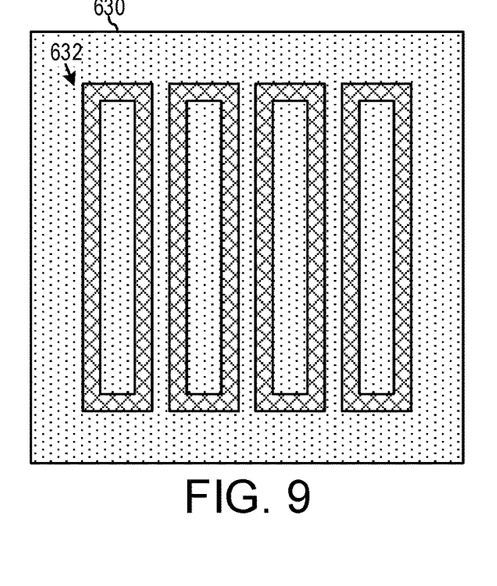

FIG. 9 is a cross-sectional diagram of an electronic package 630 for an electrically small device in accordance with an embodiment of the invention having four coils 632.

Figure 10:
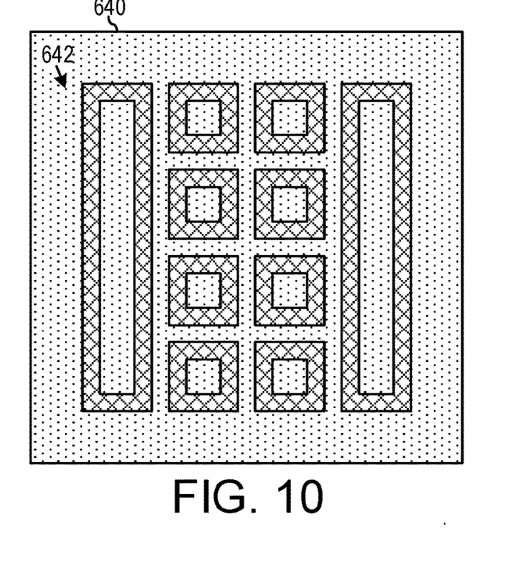

FIG. 10 is a cross-sectional diagram of an electronic package 640 for an electrically small device in accordance with an embodiment of the invention having ten coils 642.

From the above description of the Electronic Package for an Electrically Small Device with Integrated Magnetic Field Bias, it is manifest that various techniques may be used for implementing the concepts of electronic package without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that electronic package is not limited to the particular embodiments described herein, but is capable of many embodiments without departing from the scope of the claims.

We claim:

1. An electronic package comprising:
   a mounting platform for mounting an electrically small device;
   a plurality of coils for regulating a magnetic field through the electrically small device at the mounting platform, wherein the plurality of coils are adapted to conduct a plurality of currents including a respective current for each of the coils for nullifying the magnetic field through the electrically small device at the mounting platform;
   an insulator between the mounting platform and the plurality of coils for isolating the electrically small device from the plurality of coils;
   the magnetic field through the electrically small device at the mounting platform further comprising:
      a superposition of an external magnetic field including a geomagnetic field of the Earth and an internal magnetic field induced from the currents in plurality of coils; and a first component perpendicular to a plane of the mounting platform and a second component parallel to the plane of the mounting platform;

the plurality of coils further adapted to conduct the plurality of currents for inducing the internal magnetic field that has a same magnitude as the external magnetic field but in an opposing direction for nullifying the magnetic field through the electrically small device at the mounting platform; and the plurality of coils further including a central coil and at least one peripheral coil arranged adjacent the insulator, the central coil adapted to conduct the respective current for nullifying a first component of the magnetic field, and the at least one peripheral coil adapted for nullifying a second component of the magnetic field.

2. The electronic package of claim 1, further comprising a conductive plate between the mounting platform and the plurality of coils, wherein:

the insulator is an electrical insulator for electrically isolating the electrically small device from the plurality of coils; and the internal magnetic field induced from the currents in the coils passes unimpeded through the insulator toward the electrically small device, and a substantially static portion of the internal magnetic field passes unimpeded through the conductive plate toward the electrically small device.

3. The electronic package of claim 2, wherein the mounting platform includes a surface of the conductive plate opposite the plurality of coils, and the conductive plate comprising a ground plane for shielding the electrically small device from electromagnetic interference collected in the plurality of coils.

4. The electronic package of claim 2, wherein each coil of the plurality of coils is layered, alternating a plurality of patterned conductive layers and a plurality of insulation layers, each of the patterned conductive layers patterned to form a conductive loop adapted to conduct the respective current for the coil.

5. The electronic package of claim 1, further comprising a pair of conductive connectors coupled to the plurality of coils for supplying the current through the plurality of coils.

6. The electronic package of claim 1, further comprising a conductive plate between the mounting platform and the plurality of coils, wherein:

the mounting platform further comprising a surface of the conductive plate opposite the plurality of coils;

the conductive plate further comprising a ground plane for shielding the electrically small device from electromagnetic interference collected in the plurality of coils;

the insulator further comprising an electrical insulator for electrically isolating the electrically small device from the plurality of coils; and an internal magnetic field induced from the current in the plurality of coils passing unimpeded through the insulator toward the electrically small device, and a substantially static portion of the internal magnetic field passing unimpeded through the conductive plate toward the electrically small device.

7. The electronic package of claim 1, wherein each of the plurality of coils is layered, alternating a plurality of patterned conductive layers and a plurality of insulation layers, each of the patterned conductive layers patterned to form a conductive loop adapted to conduct the current.

8. The electronic package of claim 7, wherein the conductive loop of each of the patterned conductive layers is composed of a superconductive material for conducting the current when cooled to a cryogenic temperature.

9. An electronic circuit comprising:

the electronic package of claim 1; and the electrically small device mounted at the mounting platform of the electronic package, wherein the electrically small device is a quantum device and/or a topological device when cooled to a cryogenic temperature.

10. The electronic circuit of claim 9, wherein the electrically small device further comprises a radio frequency (RF) receiver and/or transmitter vulnerable to decreased performance unless the plurality of coils nullifies the magnetic field through the electrically small device.

11. The electronic circuit of claim 10, wherein the electronic package further comprises a calibration circuit including a short circuit connection, a nominal-impedance connection, and an open-circuit connection for calibrating an RF signal connection for the electrically small device.

12. The electronic circuit of claim 9, wherein the electrically small device further includes a controller adapted to control the current through the plurality of coils for nullifying the magnetic field through the electrically small device.

13. The electronic circuit of claim 12, wherein:

the electrically small device further includes a magnetic field sensor adapted to measure the magnetic field through the electrically small device; and the controller is further adapted to control the current through the plurality of coils for nullifying the magnetic field as measured by the magnetic field sensor.

14. The electronic circuit of claim 12, wherein:

the controller is adapted to control the respective current through the central coil for nullifying the first component of the magnetic field and is adapted to control the respective current through each of the at least one peripheral coil for nullifying the second component of the magnetic field.

15. The electronic circuit of claim 14, wherein:

the electrically small device further including a magnetic field sensor adapted to measure the first and second components of the magnetic field through the electrically small device; and the controller further adapted to control the respective current through the central coil and the respective current through each of the at least one peripheral coil to induce the internal magnetic field having a same magnitude as the external magnetic field but in an opposing direction for nullifying the magnetic field through the electrically small device as measured by the magnetic field sensor.

16. The electronic circuit of claim 15, wherein upon changes in three-dimensional orientation of the electronic circuit relative to the external magnetic field or the geomagnetic field:

the magnetic field sensor is adapted to measure corresponding changes in the first and second components of the magnetic field through the electrically small device; and the controller is adapted to continue to control the respective current through the central coil and the respective current through each of the at least one peripheral coil to induce the internal magnetic field having a same magnitude as the external magnetic field but in an opposing direction for nullifying the magnetic field through the electrically small device as measured by the magnetic field sensor.

\* \* \* \* \*